US010566342B2

(12) United States Patent
Hwang et al.

(10) Patent No.: US 10,566,342 B2
(45) Date of Patent: Feb. 18, 2020

(54) SEMICONDUCTOR MEMORY DEVICES INCLUDING A STRESS RELIEF REGION

(71) Applicant: Samsung Electronics Co., Ltd., Suwon-si, Gyeonggi-do (KR)

(72) Inventors: Sung-Min Hwang, Hwaseong-si (KR); Jang-Gn Yun, Hwaseong-si (KR); Joon-Sung Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/805,760

(22) Filed: Nov. 7, 2017

(65) Prior Publication Data

US 2018/0254284 A1    Sep. 6, 2018

(30) Foreign Application Priority Data

Mar. 3, 2017   (KR) .................. 10-2017-0027808

(51) Int. Cl.
| | |
|---|---|
| *H01L 27/11575* | (2017.01) |
| *H01L 27/11524* | (2017.01) |
| *H01L 27/11556* | (2017.01) |
| *H01L 27/11529* | (2017.01) |
| *H01L 27/11548* | (2017.01) |
| *H01L 27/11582* | (2017.01) |
| *H01L 27/11573* | (2017.01) |
| *H01L 23/00* | (2006.01) |
| *G11C 16/26* | (2006.01) |
| *G11C 16/10* | (2006.01) |
| *H01L 27/1157* | (2017.01) |
| *G11C 16/08* | (2006.01) |

(52) U.S. Cl.
CPC ........ *H01L 27/11575* (2013.01); *G11C 16/10* (2013.01); *G11C 16/26* (2013.01); *H01L 23/562* (2013.01); *H01L 27/1157* (2013.01); *H01L 27/11524* (2013.01); *H01L 27/11529* (2013.01); *H01L 27/11548* (2013.01); *H01L 27/11556* (2013.01); *H01L 27/11573* (2013.01); *H01L 27/11582* (2013.01); *G11C 16/08* (2013.01)

(58) Field of Classification Search
CPC .......... H01L 27/11575; H01L 27/1157; H01L 27/11556; H01L 23/562; H01L 27/11548; H01L 27/11529; H01L 27/11573; H01L 27/11582; H01L 27/11524; G11C 16/26; G11C 16/10; G11C 16/08
See application file for complete search history.

(56) References Cited

U.S. PATENT DOCUMENTS

| | | | |
|---|---|---|---|
| 8,013,383 B2 | 9/2011 | Kidoh et al. | |
| 8,426,308 B2 | 4/2013 | Han et al. | |
| 9,105,514 B2 | 8/2015 | Shin | |
| 9,287,265 B2 | 3/2016 | Park et al. | |
| 9,425,299 B1 * | 8/2016 | Rabkin | ............... H01L 29/7783 |
| 9,431,418 B2 * | 8/2016 | Jung | ................. H01L 27/11582 |

(Continued)

FOREIGN PATENT DOCUMENTS

KR    10-2012-0030782    3/2013

*Primary Examiner* — Victor A Mandala
(74) *Attorney, Agent, or Firm* — Myers Bigel, P.A.

(57) ABSTRACT

Semiconductor memory devices are provided. A semiconductor memory device includes a memory cell region and an insulator on a portion of the memory cell region. The semiconductor memory device includes a stress relief material that is in the insulator and is between the memory cell region and another region of the semiconductor memory device.

20 Claims, 15 Drawing Sheets

(56) References Cited

U.S. PATENT DOCUMENTS

| | | | |
|---|---|---|---|
| 9,478,495 B1* | 10/2016 | Pachamuthu | H01L 23/53223 |
| 2015/0348987 A1* | 12/2015 | Lee | H01L 27/11573 |
| | | | 257/326 |
| 2016/0093668 A1 | 3/2016 | Lu et al. | |
| 2017/0221919 A1* | 8/2017 | Chung | H01L 27/11575 |

* cited by examiner

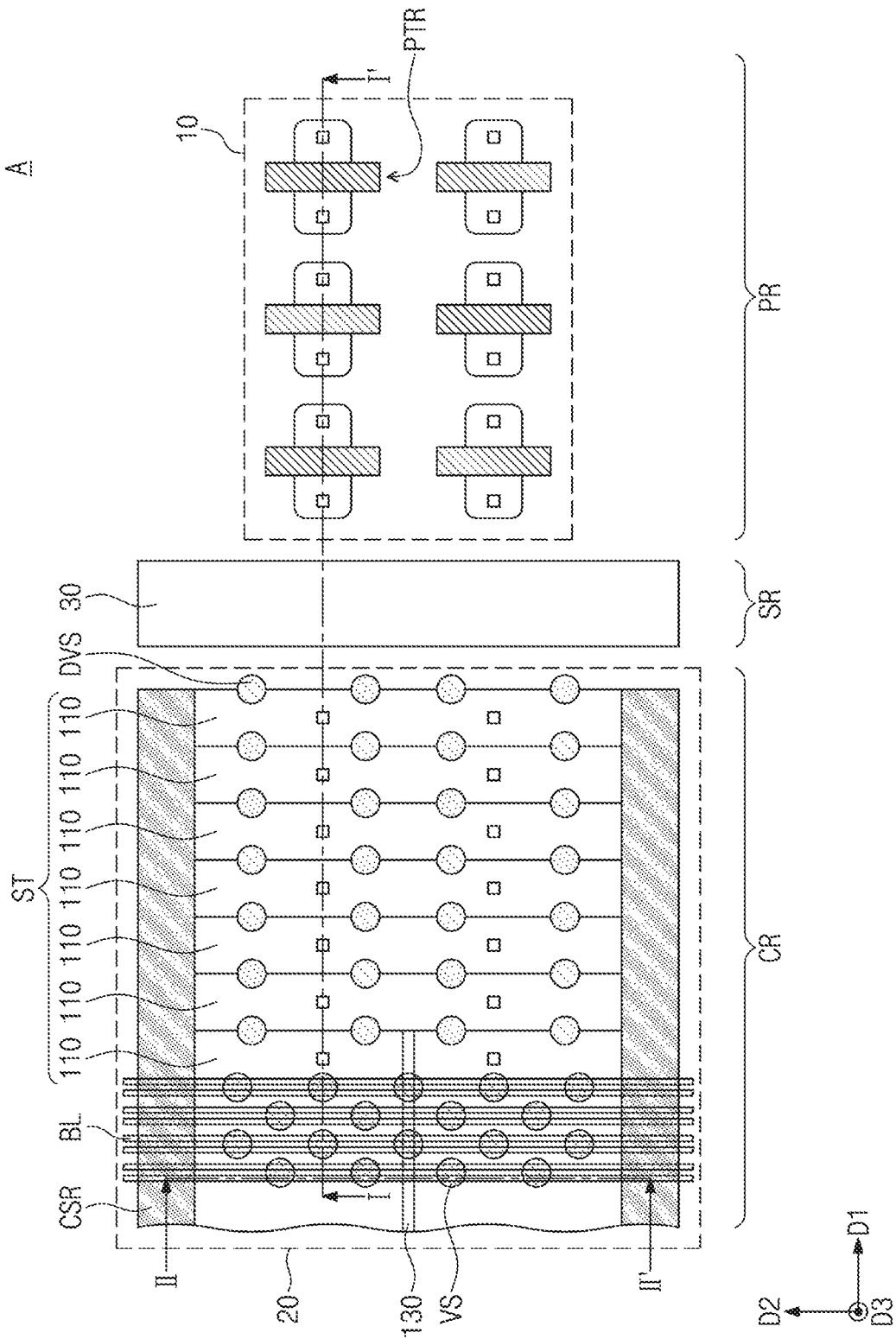

SEMICONDUCTOR MEMORY DEVICES INCLUDING A STRESS RELIEF REGION

CROSS-REFERENCE TO RELATED APPLICATION

This application claims priority under 35 U.S.C. § 119 to Korean Patent Application No. 10-2017-0027808, filed on Mar. 3, 2017 in the Korean Intellectual Property Office, the disclosure of which is hereby incorporated herein by reference in its entirety.

The present disclosure relates to semiconductor devices, and more specifically, to semiconductor memory devices. A semiconductor device may be highly integrated to meet demands of high performance and low costs. For example, an integration density of a two-dimensional (2D) or planar semiconductor device may be mainly determined by an area needed for a unit memory cell. Therefore, the integration density of the 2D or planar semiconductor device may depend on a technique used for fine pattern formation. However, high-cost equipment may be used for such fine pattern formation in the 2D or planar semiconductor manufacturing process, and the increase of the integration density of the 2D or planar semiconductor device may be limited.

SUMMARY

According to example embodiments of the inventive concepts, a semiconductor memory device may include a substrate including a cell array region, a peripheral circuit region, and a stress relief region that is between the cell array region and the peripheral circuit region. The semiconductor memory device may include a memory structure on the substrate in the cell array region, and may include a peripheral structure on the substrate in the peripheral circuit region. Moreover, the semiconductor device may include an interlayer insulating layer on at least a portion of the memory structure and the peripheral structure, and may include a stress relief structure in the interlayer insulating layer in the stress relief region.

According to example embodiments of the inventive concepts, a semiconductor memory device may include a substrate including a pair of cell array regions and a stress relief region between the pair of cell array regions. The semiconductor memory device may include a pair of memory structures on the substrate in the pair of cell array regions. The semiconductor device may include an interlayer insulating layer on at least portions of the pair of memory structures. Moreover, the semiconductor memory device may include a stress relief structure in the interlayer insulating layer in the stress relief region.

A semiconductor memory device, according to various embodiments, includes a memory cell region that may include a stack of alternating conductive layers and insulating layers. The semiconductor memory device includes a semiconductor structure in the stack. The semiconductor memory device includes an insulator that may be on a stepped portion of the stack. Moreover, the semiconductor memory device includes a stress relief material that may be in the insulator. The stress relief material may have a lower dielectric constant than the insulator, may be between the stepped portion of the stack and another region of the semiconductor memory device, and may be wider than the semiconductor structure.

BRIEF DESCRIPTION OF THE DRAWINGS

FIG. 2 is a plan view illustrating a semiconductor device according to example embodiments.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
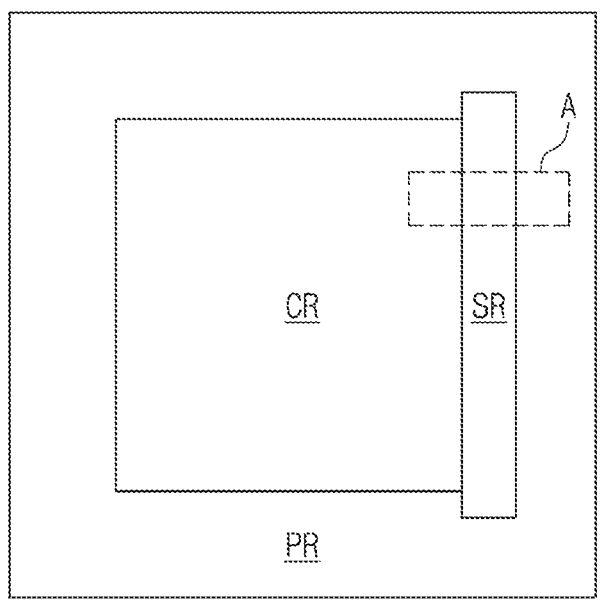
FIG. 1 is a plan view illustrating a semiconductor device, for example, a three-dimensional semiconductor device according to example embodiments.

FIG. 1 is a plan view illustrating a semiconductor device, for example, a three-dimensional semiconductor device according to example embodiments.

Referring to FIG. 1, a semiconductor device may include a cell (e.g., memory cell) array region CR and a peripheral circuit region PR. In plan view, the peripheral circuit region PR may be disposed around the cell array region CR. For example, the peripheral circuit region PR may surround, or may otherwise extend to define a perimeter around, the cell array region CR in plan view.

A memory cell array constituted by (e.g., including) a plurality of memory cells may be disposed in the cell array region CR. The memory cell array may include three-dimensionally arranged memory cells, a plurality of word lines connected to the memory cells and a plurality of bit lines connected to the memory cells. Although the word "array" is used herein, the cell array region CR may refer to any memory cell region that includes a plurality of memory cells.

The peripheral circuit region PR may include a row decoder region, a page buffer region, a column decoder region and a control circuit region.

A row decoder for selecting the word lines of the memory cell array may be disposed in the row decoder region. The row decoder may select one of the word lines in accordance with address information (e.g., an address) and may provide a word line voltage to the selected word line and the unselected word line in response to a control signal of a control circuit in the control circuit region.

In the page buffer region, a page buffer for reading data stored in the memory cells may be disposed. The page buffer may temporarily store data to be stored in the memory cells or may sense the data stored in the memory cells, according to an operation mode. The page buffer may operate as a write driver circuit in a program operation mode and may operate as a sense amplifier circuit in a read operation mode.

A column decoder may be disposed in the column decoder region to be connected to the bit lines of the memory cell array. The column decoder may provide a data transmission path between the page buffer and an external device (e.g., a memory controller).

The semiconductor device may include a stress relief region SR provided between at least a portion of the cell array region CR and the peripheral circuit region PR.

In plan view, the cell array region CR may have a tetragonal shape (i.e., may have four sides). The stress relief region SR may be disposed between at least one side of the cell array region CR and the peripheral circuit region PR. In some embodiments, as shown in FIG. 1, the stress relief region SR may have a linear shape extending in a direction in plan view. However, the present inventive concepts are not limited thereto.

Figure 3A:
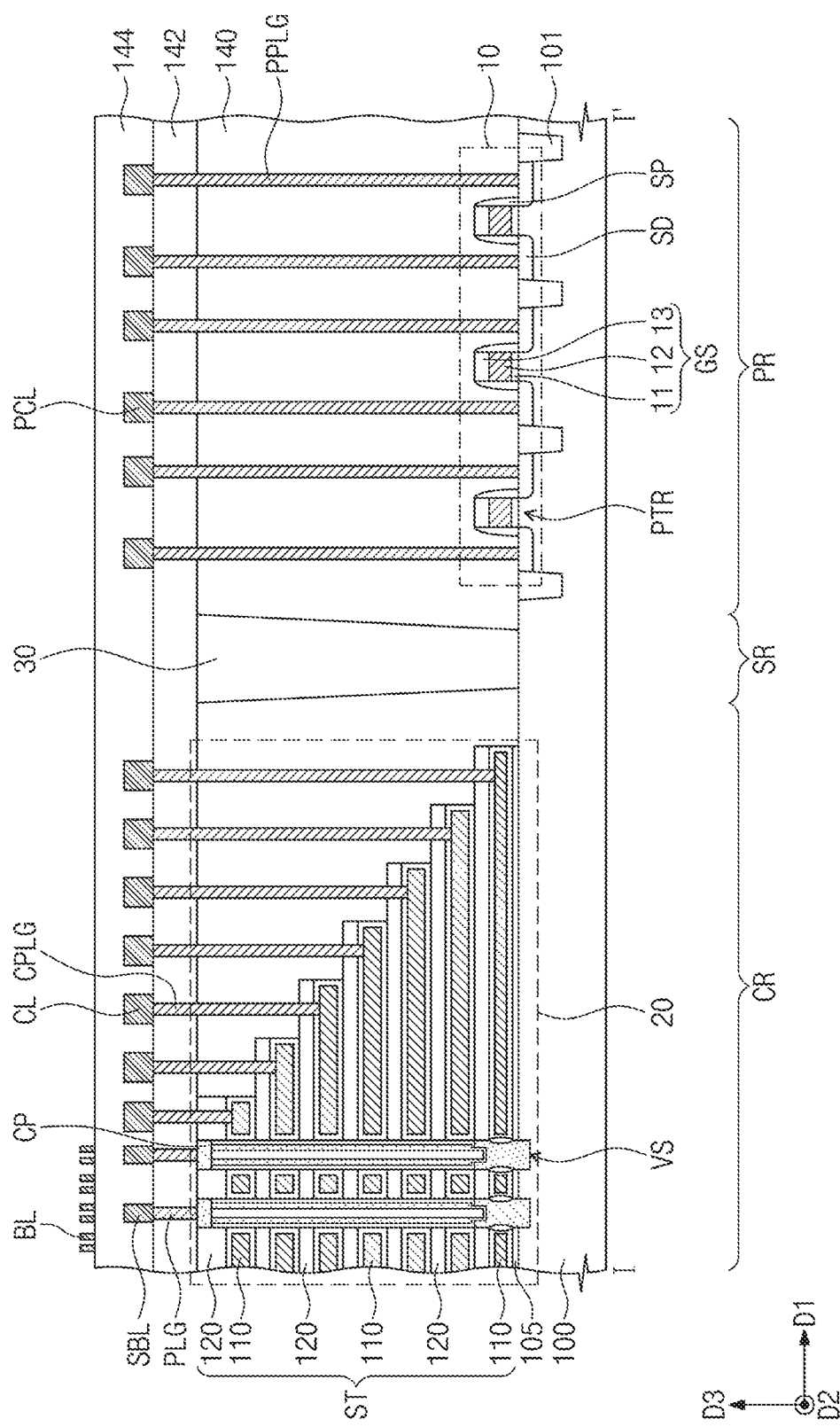
FIGS. 3A and 3B are cross-sectional views illustrating a semiconductor device according to example embodiments.
Figure 3B:
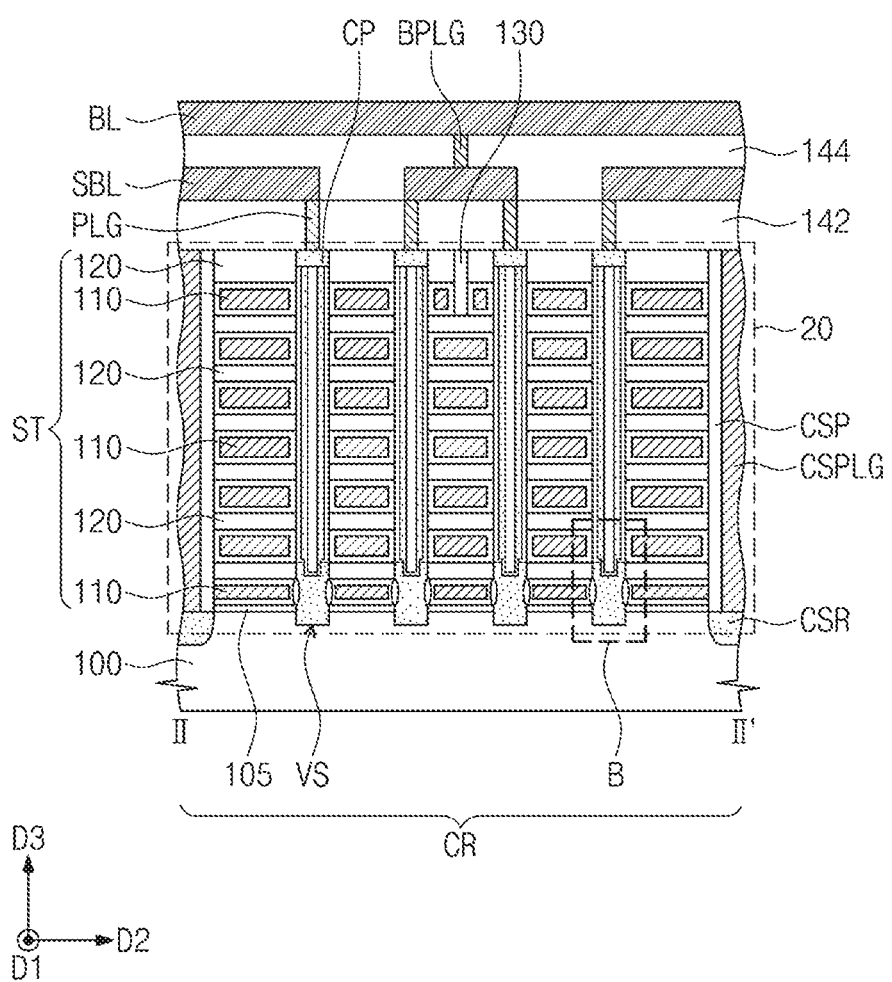
Figure 4:
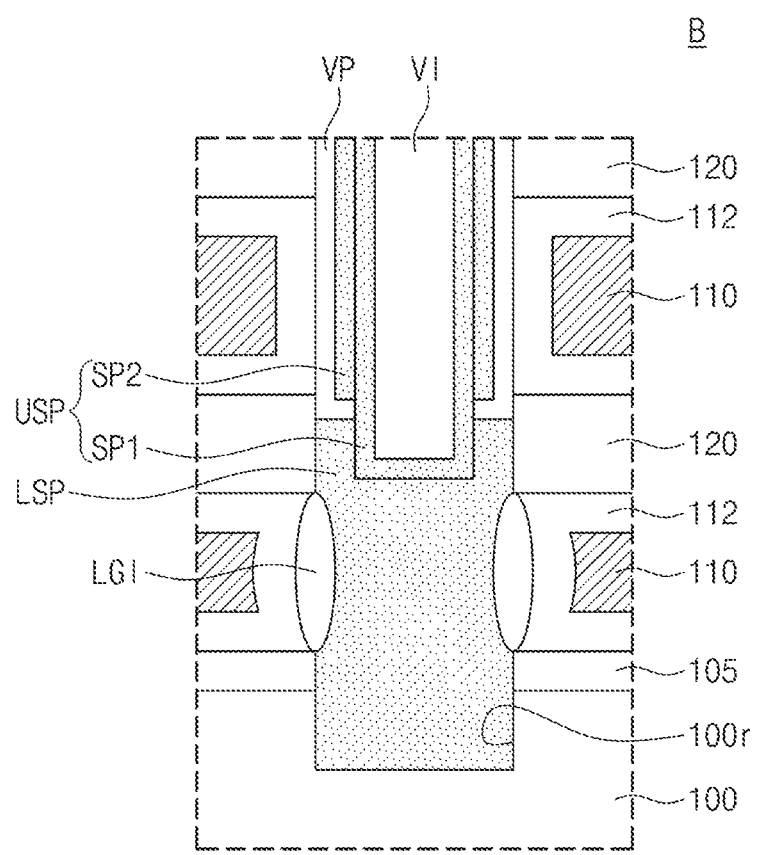
FIG. 4 is an enlarged view illustrating portion B of FIG. 3B.

FIG. 2 is a plan view illustrating a semiconductor device according to example embodiments. For example, FIG. 2 is a plan view illustrating portion A of FIG. 1. FIGS. 3A and 3B are cross-sectional views illustrating a semiconductor device according to example embodiments. FIG. 3A is a cross-sectional view taken along line I-I' of FIG. 2. FIG. 3B is a cross-sectional view taken along line of FIG. 2. FIG. 4 is an enlarged view illustrating portion B of FIG. 3B.

Referring to FIGS. 2, 3A, 3B, and 4, a substrate 100 may include the memory cell array region CR, the peripheral circuit region PR and the stress relief region SR. The cell array region CR and the peripheral circuit region PR may be spaced apart from each other in a first direction D1. The stress relief region SR may be positioned between the cell array region CR and the peripheral circuit region PR.

The substrate 100 may be a semiconductor substrate. For example, the substrate 100 may include a mono-crystalline silicon layer, a mono-crystalline germanium layer, a silicon layer on a silicon-germanium layer, a silicon layer on an insulating layer or a polycrystalline semiconductor layer on an insulating layer. The substrate 100 may be a silicon wafer of a first conductivity type (e.g., a p-type wafer).

A peripheral structure 10 may be disposed on the substrate 100 in the peripheral circuit region PR. As described with respect to FIG. 1, the peripheral structure 10 may include the row decoder, the column decoder, the page buffer and/or the control circuit, for writing data in the memory cells and reading the data from the memory cells. Accordingly, the peripheral circuit region PR may be referred to herein as including circuitry that is configured to read and write data of memory cells that are in the memory cell region CR.

The peripheral structure 10 may include peripheral transistors PTR in the peripheral circuit region PR. The peripheral transistors PTR may each be disposed on an active region in the peripheral circuit region PR, defined by an isolation layer 101. The peripheral transistors PTR may each include a gate stack GS on the active region, spacers SP on opposite sidewalls of the gate stack GS, and source/drain regions SD in the active region at opposite sides of the gate stack GS. The gate stack GS may include a gate insulating pattern 11, a gate pattern 12 and a mask pattern 13 that are sequentially stacked on the active region.

A memory structure 20 may be disposed on the substrate 100 in the cell array region CR. The memory structure 20 may include a stack structure ST and vertical structures VS.

The stack structure ST may be disposed on the substrate 100 in the cell array region CR. The stack structure ST may include conductive patterns 110 and insulating patterns 120 that are alternately and repeatedly stacked on each other.

The stack structure ST may extend in the first direction D1 but not extend to the stress relief region SR and the peripheral circuit region PR. The stack structure ST may have a stepped structure adjacent to the peripheral circuit region PR. The stepped structure may be a structure descending toward the substrate 100 as the cell array region CR is closer to the peripheral circuit region PR. With the exception of an uppermost one of the conductive patterns 110, the conductive patterns 110 may each include a pad portion exposed by another conductive pattern 110 immediately thereabove. In some embodiments, the stack structure ST may include a plurality of stack structures that are spaced apart from one another in a second direction D2 crossing or perpendicular to the first direction D1.

A lowermost one of the conductive patterns 110 may provide/act as a ground selection line, and the uppermost one of the conductive patterns 110 may provide/act as a string selection line. The other conductive patterns 110 between the ground selection line and the string selection line may provide/act as word lines. The conductive patterns 110 may include a conductive material. For example, the conductive patterns 110 may include metal (e.g., tungsten (W), aluminum (Al), titanium (Ti), tantalum (Ta), cobalt (Co), or copper (Cu)) and/or metal nitride (e.g., titanium nitride (TiN), tantalum nitride (TaN), or tungsten nitride (WN)).

The insulating patterns 120 may include an insulating material. For example, the insulating patterns 120 may include silicon oxide.

A buffer insulating layer 105 may be disposed between the stack structure ST and the substrate 100. A thickness of the buffer insulating layer 105 may be less than a thickness of each of the insulating patterns 120. The buffer insulating layer 105 may include, for example, silicon oxide.

A separation insulating layer 130 (FIGS. 2 and 3B) may be disposed in an upper portion of the stack structure ST. The separation insulating layer 130 may separate/divide the uppermost conductive pattern 110 in the second direction D2. The separation insulating layer 130 may include, for example, silicon oxide.

Common source regions CSR (FIGS. 2 and 3B) may be disposed in the substrate 100 at opposite sides of the stack structure ST in the second direction D2. For example, the common source regions CSR may be disposed in the substrate 100 between the plurality of stack structures ST separated from each other in the second direction D2. The common source regions CSR may each extend in the first direction D1 but not extend to the peripheral circuit region PR. The common source regions CSR may be doped with an impurity of a second conductivity type (e.g., an n-type impurity) different from an impurity of the first conductivity type.

On the common source regions CSR, common source plugs CSPLG (FIG. 3B) may be disposed. The common source plugs CSPLG may directly contact the common source regions CSR, respectively. The common source plugs CSPLG may each extend in the first direction D1. The common source plugs CSPLG may include metal, for example, W, Cu, Al, Ti or Ta.

Insulating spacers CSP may be disposed between the common source plugs CSPLG and the stack structure ST. The insulating spacers CSP may include, for example, silicon oxide, silicon nitride and/or silicon oxynitride.

The vertical structures VS may be disposed on the substrate 100 in the cell array region CR. The vertical structures VS may each penetrate the stack structure ST and the buffer insulating layer 105.

In plan view, the vertical structures VS may be arranged in a common direction or in a zigzag manner. In some embodiments, the vertical structures VS may be arranged along a plurality of (e.g., nine) rows extending in the first direction D1, as shown in FIG. 2. In some embodiments, the vertical structures VS included in a fifth row may not be connected to a bit line BL, and the vertical structures VS included in the other rows may be connected to the bit line BL.

Referring to FIG. 4, the vertical structures VS may each include a lower semiconductor pattern LSP, an upper semiconductor pattern USP, a buried insulating pattern VI, a vertical insulating pattern VP, a lower gate insulating layer LGI and a conductive pad CP (FIGS. 3A and 3B).

The lower semiconductor pattern LSP may be provided at a lower portion of each of the vertical structures VS and may contact the substrate 100. The lower semiconductor pattern LSP may have a pillar shape and may extend in a third direction D3 vertical/perpendicular to an upper surface of the substrate 100. The lower semiconductor pattern LSP may fill a recess region 100r in the upper surface of the substrate 100 and may penetrate the lowermost conductive pattern 110. An upper surface of the lower semiconductor pattern LSP may be at a higher level than a lower surface of a lowermost one of the insulating patterns 120 and at a lower level than an upper surface of the lowermost insulating pattern 120, relative to the upper surface of the substrate 100. The lower semiconductor pattern LSP may include silicon which is selectively epitaxially grown using the substrate 100 as a seed. The lower semiconductor pattern LSP may have the same conductivity type as the substrate 100.

The lower gate insulating layer LGI may be disposed between the lower semiconductor pattern LSP and the lowermost conductive pattern 110. The lower gate insulating layer LGI may include, for example, silicon oxide.

The upper semiconductor pattern USP may be disposed on the lower semiconductor pattern LSP. The upper semiconductor pattern USP may extend in the third direction D3. A lower portion of the upper semiconductor pattern USP may be electrically connected to the lower semiconductor pattern LSP, and an upper portion of the upper semiconductor pattern USP may be electrically connected to the bit line BL.

The upper semiconductor pattern USP may have a hollow pipe shape or a macaroni shape. A bottom end of the upper semiconductor pattern USP may be in a closed state. An inner space of the upper semiconductor pattern USP may be filled with the buried insulating pattern VI. A lower surface of the upper semiconductor pattern USP may be at a lower level than an uppermost surface of the lower semiconductor pattern LSP relative to the upper surface of the substrate 100.

In some embodiments, the upper semiconductor pattern USP may include a first semiconductor pattern SP1 and a second semiconductor pattern SP2, as shown in FIG. 4. The first semiconductor pattern SP1 may contact the lower semiconductor pattern LSP and may have a pipe shape or a macaroni shape of which a bottom end is in a closed state. In some embodiments, an inner space of the first semiconductor pattern SP1 may include (e.g., be filled with) the buried insulating pattern VI. The first semiconductor pattern SP1 may extend into the lower semiconductor pattern LSP such that a portion of the semiconductor pattern SP1 may be inserted inside (e.g., in a recessed portion of) the lower semiconductor pattern LSP. The first semiconductor pattern SP1 may contact an inner surface of the second semiconductor pattern SP2 and the upper surface of the lower semiconductor pattern LSP. Thus, the first semiconductor pattern SP1 may be electrically connected to the second semiconductor pattern SP2 and the lower semiconductor pattern LSP. The second semiconductor pattern SP2 may have a pipe shape or a macaroni shape of which a top end and a bottom end are opened. The second semiconductor pattern SP2 may be spaced apart from the lower semiconductor pattern LSP, and thus may not contact the lower semiconductor pattern LSP.

The upper semiconductor pattern USP may have the same conductivity type as the substrate 100 or may be in an undoped state. The upper semiconductor pattern USP may include silicon, germanium or a mixture thereof and may include doped semiconductor or undoped (or intrinsic) semiconductor.

The conductive pad CP (FIGS. 3A and 3B) may be disposed on the upper semiconductor pattern USP. The conductive pad CP may include doped semiconductor or metal.

The vertical insulating pattern VP may be disposed between the upper semiconductor pattern USP and the conductive patterns 110. The vertical insulating pattern VP may include a blocking insulating layer adjacent to the conductive patterns 110, a tunnel insulating layer adjacent to the upper semiconductor pattern USP and a charge storage layer between the blocking insulating layer and the tunnel insulating layer. The tunnel insulating layer may include, for example, silicon oxide. The charge storage layer may include, for example, silicon nitride, silicon oxynitride, silicon-rich nitride, an insulating layer including conductive nano-dots or a laminated trap layer. The blocking insulating layer may include, silicon oxide, silicon nitride and/or silicon oxynitride.

Horizontal insulating patterns 112 may be disposed between the vertical structures VS and the conductive patterns 110. The horizontal insulating patterns 112 may extend on an upper surface and a lower surface of respective ones of the conductive patterns 110. The horizontal insulating patterns 112 may include, for example, silicon oxide, metal oxide or metal nitride.

Dummy vertical structures DVS (FIG. 2) may be disposed on the stepped structure of the stack structure ST. The dummy vertical structures DVS may be substantially the same as the vertical structure VS. The dummy vertical structures DVS may penetrate edge portions of the conductive patterns 110.

A first interlayer insulating layer 140 (FIG. 3A) may be disposed on the substrate 100 to cover the peripheral structure 10 and at least a portion of the memory structure 20. For example, the first interlayer insulating layer 140 may cover the stepped structure of the stack structure ST and the peripheral structure 10. The first interlayer insulating layer 140 may thus be referred to herein as "an insulator on a stepped portion" of the stack structure ST. An upper surface of the first interlayer insulating layer 140 may be substantially coplanar with an upper surface of the stack structure ST. The first interlayer insulating layer 140 may include silicon oxide. A dielectric constant of the first interlayer insulating layer 140 may range from about 3.9 to about 5. For example, the first interlayer insulating layer 140 may include, for example, tetraethyl orthosilicate (TEOS) formed by a plasma enhanced chemical deposition process.

A stress relief structure 30 (FIGS. 2 and 3A) may be disposed on the substrate 100 in the stress relief region SR. The stress relief structure 30 may be disposed between the stack structure ST and the peripheral structure 10. The stress relief structure 30 may be disposed in the first interlayer insulating layer 140. In some embodiments, the stress relief structure 30 may penetrate an upper surface and/or a lower surface of the first interlayer insulating layer 140. The stress relief structure 30 may extend vertically in the third direction D3 in the first interlayer insulating layer 140. Referring to FIG. 3A, a lower surface of the stress relief structure 30 may be substantially coplanar with a lower surface of the first interlayer insulating layer 140, and an upper surface of the stress relief structure 30 may be substantially coplanar with an upper surface of the first interlayer insulating layer 140. For example, the stress relief structure 30 may protrude in the third direction D3 from the substrate 100 to a level that is above an uppermost surface of the uppermost one of the conductive patterns 110 of the stack ST. However, the present inventive concepts are not limited thereto. Moreover, the stress relief structure 30 may also be referred to herein as the "stress relief region," the "stress relief layer," or the "stress relief material," and the conductive patterns 110 may also be referred to herein as "conductive layers."

The stress relief structure 30 may include a different material from the first interlayer insulating layer 140. The stress relief structure 30 may include a material capable of relaxing stress between the cell array region CR and the peripheral circuit region PR. The stress relief structure 30 is not merely a spacer. For example, the stress relief structure 30 may be taller (in the third direction D3) and wider (in the first direction D1) than a spacer SP of the peripheral circuit region PR. Moreover, the stress relief structure 30 may be wider, in the first direction D1, than one of the vertical structures VS.

In some embodiments, the stress relief structure 30 may include a material having a lower dielectric constant than the first interlayer insulating layer 140. For example, the stress relief structure 30 may include fluorine-doped silicon oxide, carbon-doped silicon oxide, porous silicon oxide, polyimide, polynorbornene, benzocyclobutene, polytetrafluoroethylene (PTFE), hydrogen silsesquioxane (HSQ) or methylsilsesquioxane (MSQ). Alternatively, the stress relief structure 30 may include silicon nitride or silicon oxynitride.

As illustrated in FIG. 3A, a second interlayer insulating layer 142 may be disposed on the first interlayer insulating layer 140. The second interlayer insulating layer 142 may extend in the first direction D1 across each of the cell array region CR, the stress relief region SR, and the peripheral circuit region PR such that the second interlayer insulating layer 142 may cover the memory structure 20, the common source plugs CSPLG (FIG. 3B), the stress relief structure 30 and the first interlayer insulating layer 140. The second interlayer insulating layer 142 may include, for example, silicon oxide, silicon nitride or silicon oxynitride.

Contact plugs PLG and cell contact plugs CPLG may be disposed on the substrate 100 in the cell array region CR. The contact plugs PLG may penetrate the second interlayer insulating layer 142 to contact the vertical structures VS, respectively. The cell contact plugs CPLG may penetrate the first and second interlayer insulating layers 140 and 142 to contact the conductive patterns 110, respectively.

Peripheral contact plugs PPLG may be disposed on the substrate 100 in the peripheral circuit region PR. The peripheral contact plugs PPLG may penetrate the first and second interlayer insulating layers 140 and 142 to electrically connect to the peripheral transistors PTR. For example, the peripheral contact plugs PPLG may be connected to the source/drain regions SD and/or the gate stacks GS.

Sub bit lines SBL may be disposed on the second interlayer insulating layer 142 in the cell array region CR. The sub bit lines SBL may each be connected to a pair of the contact plugs PLG. For example, the sub bit lines SBL may each be electrically connected to a pair of the vertical structures VS that are adjacent to each other with the separation insulating layer 130 or the common source plug CSPLG therebetween.

Interconnection lines CL (FIG. 3A) may be disposed on the second interlayer insulating layer 142 in the cell array region CR. The interconnection lines CL may be connected to the cell contact plugs CPLG.

Peripheral interconnection lines PCL may be disposed on the second interlayer insulating layer 142 in the peripheral circuit region PR. The peripheral interconnection lines PCL may be connected to the peripheral contact plugs PPLG.

A third interlayer insulating layer 144 may be disposed on the second interlayer insulating layer 142. The third interlayer insulating layer 144 may cover the sub bit lines SBL, the interconnection lines CL, and the peripheral interconnection lines PCL. The third interlayer insulating layer 144 may include, for example, silicon oxide, silicon nitride or silicon oxynitride.

The bit lines BL may be disposed on the third interlayer insulating layer 144. The bit lines BL may extend in the second direction D2 and may be connected to the sub bit lines SBL through a bit line contact plug BPLG (FIG. 3B).

According to some example embodiments, the stress relief region SR may be provided between the cell array region CR and the peripheral circuit region PR. The stress relief structure 30 may be disposed in the first interlayer insulating layer 140 in the stress relief region SR. The stress relief structure 30 may include a material capable of relaxing the stress between the cell array region CR and the peripheral circuit region PR. Thus, the stress between the cell array region CR and the peripheral circuit region PR may be relaxed.

Figure 5A:
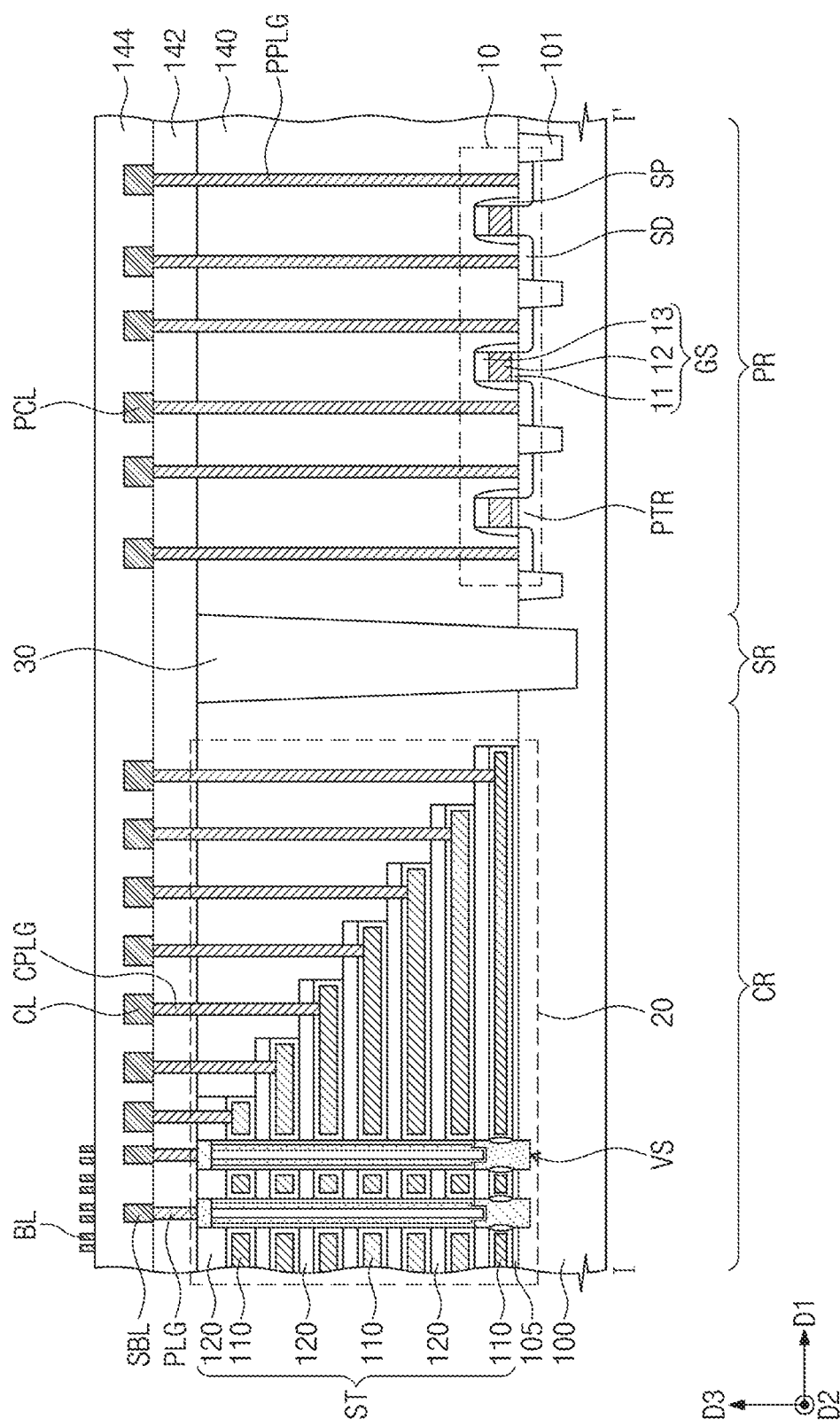
FIGS. 5A to 5C are cross-sectional views illustrating a semiconductor device according to example embodiments.
Figure 5B:
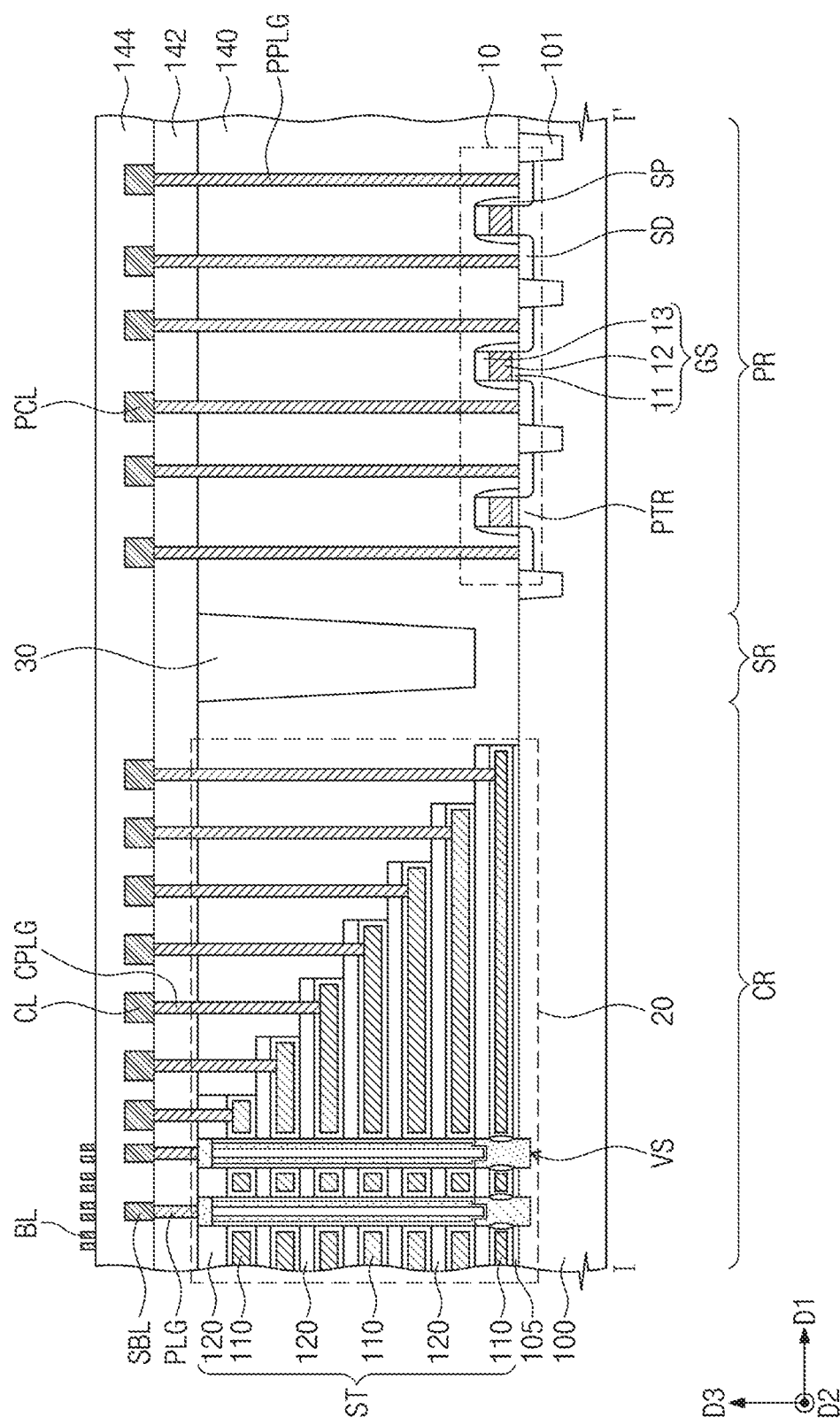
Figure 5C:
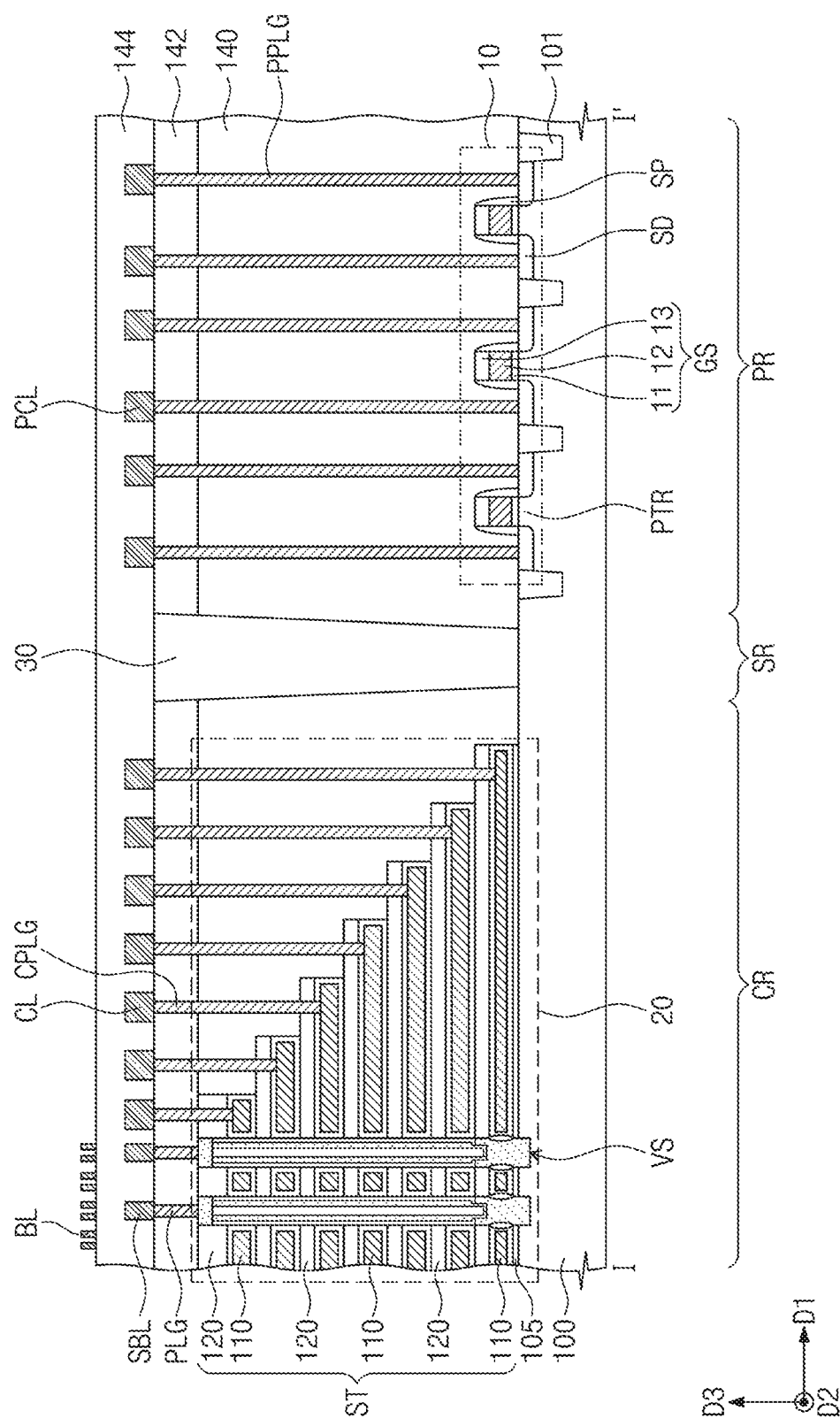

FIGS. 5A to 5C are cross-sectional views illustrating a semiconductor device according to example embodiments. FIGS. 5A to 5C are respective cross-sectional views taken along line I-I' of FIG. 2. In FIGS. 5A to 5C, the same reference numerals are used to denote the same elements as in FIGS. 2, 3A and 3B, and thus repeated descriptions thereof may be omitted. Hereinafter, example modifications of a cross-sectional shape of the stress relief structure 30 are mainly described.

Referring to FIG. 5A, the stress relief structure 30 may be disposed on the substrate 100 in the stress relief region SR. The stress relief structure 30 may be disposed in the first interlayer insulating layer 140. The stress relief structure 30 may penetrate all the way through the first interlayer insulating layer 140 such that a lower portion of the stress relief structure 30 may extend or be inserted into the substrate 100 (e.g., into a recessed portion of the substrate 100). Thus, a lower surface of the stress relief structure 30 may be positioned at a lower level than a lower surface of the first interlayer insulating layer 140 relative to the upper surface of the substrate 100.

Referring to FIG. 5B, the stress relief structure 30 may be disposed on the substrate 100 in the stress relief region SR. The stress relief structure 30 may be disposed in the first interlayer insulating layer 140. A lower surface of the stress relief structure 30 may be positioned at a higher level than a lower surface of the first interlayer insulating layer 140 relative to the upper surface of the substrate 100. For example, the stress relief structure 30 may not penetrate all the way through the first interlayer insulating layer 140, but rather may only partially penetrate the first interlayer insulating layer 140.

Referring to FIG. 5C, the stress relief structure 30 may be disposed on the substrate 100 in the stress relief region SR. The stress relief structure 30 may be disposed in the first and second interlayer insulating layers 140 and 142. The stress relief structure 30 may penetrate the first and second interlayer insulating layers 140 and 142. For example, an upper surface of the stress relief structure 30 may be substantially coplanar with an upper surface of the second interlayer insulating layer 142.

FIGS. 6A to 6D are plan views illustrating a semiconductor device according to example embodiments. Hereinafter, example modifications of a planar shape of the stress relief structure 30 are mainly described. Portions A of FIGS. 6A to 6D are substantially the same as portions A described with reference to FIGS. 2, 3A, 3B, 4, and/or 5A to 5C.

Figure 6A:
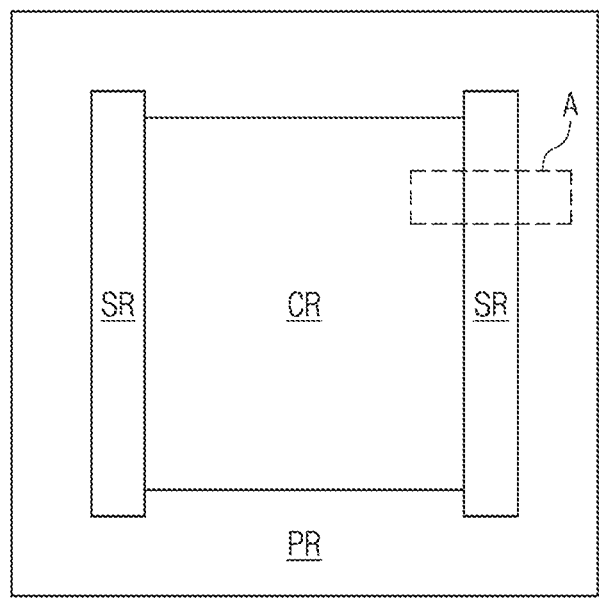
FIGS. 6A to 6D are plan views illustrating a semiconductor device according to example embodiments.
Figure 6B:
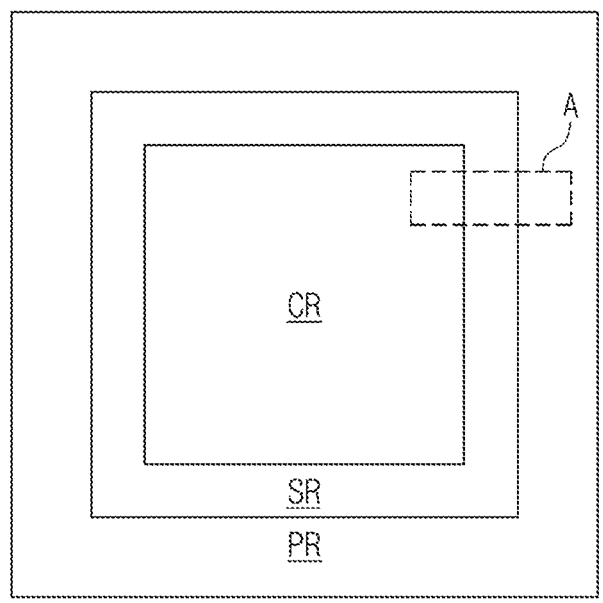
Figure 6C:
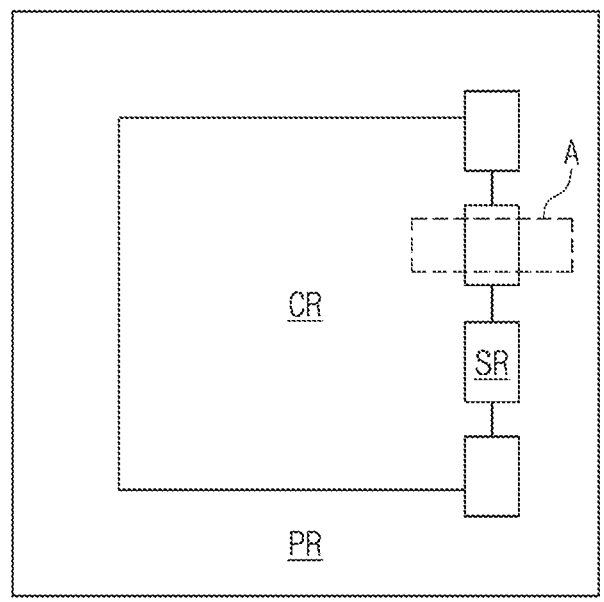

Referring to FIGS. 6A to 6C, in plan view, the cell array region CR may have a tetragonal shape. The stress relief region SR may be disposed between at least one side of the cell array region CR and the peripheral circuit region PR.

Referring to FIG. 6A, a plurality of the stress relief regions SR may be provided. The stress relief regions SR may be disposed between respective sides of the cell array region CR and the peripheral circuit region PR. The stress relief regions SR may each have a linear shape.

In some embodiments, the stress relief regions SR may be disposed between two opposite sides of the cell array region CR and the peripheral circuit region PR, as shown in FIG. 6A. Alternatively, the stress relief regions SR may be disposed between the peripheral circuit region PR and two immediately adjacent (i.e., intersecting) sides of the cell array region CR.

Referring to FIG. 6B, in plan view, the stress relief region SR may be disposed to surround the cell array region CR. In plan view, the cell array region CR and the peripheral circuit region PR may be separated by the stress relief region SR. The stress relief region SR may optionally extend continuously around the memory cell region CR.

Referring to FIG. 6C, a plurality of the stress relief regions SR may be provided. The stress relief regions SR may be arranged along at least one side of the cell array region CR in such a way that the stress relief regions SR are spaced apart from one another.

In some embodiments, as shown in FIG. 6C, the stress relief regions SR may be arranged along one (i.e., the same) side of the cell array region CR. Alternatively, the stress relief regions SR may be arranged along multiple sides of the cell array region CR.

Figure 6D:
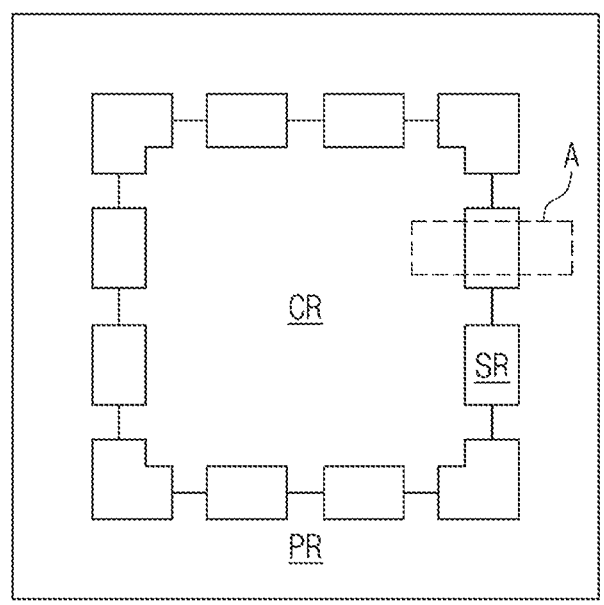

Referring to FIG. 6D, a plurality of the stress relief regions SR may be provided. The stress relief regions SR, which may be spaced apart from one another, may be arranged along all four sides of the cell array region CR.

Figure 7:
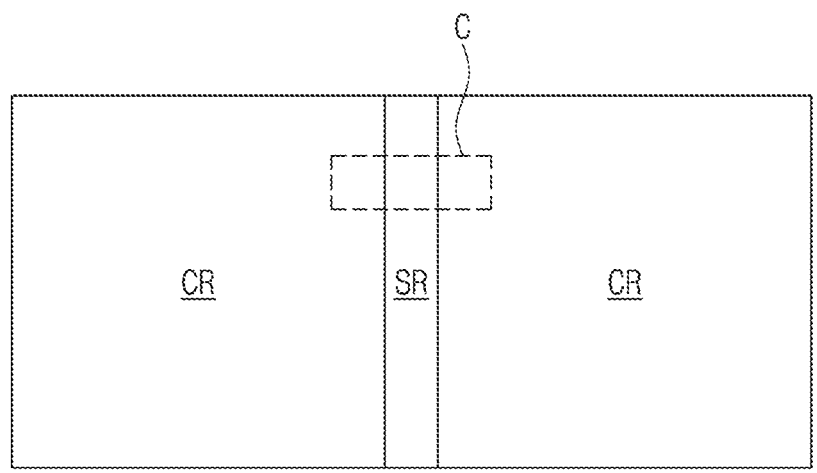
FIG. 7 is a plan view illustrating a semiconductor device according to example embodiments.

FIG. 7 is a plan view illustrating a semiconductor device according to example embodiments. For example, the semiconductor device according to example embodiments may be a three-dimensional memory device.

Referring to FIG. 7, the semiconductor device may include cell array regions CR and a stress relief region SR. The stress relief region SR may be disposed between the cell array regions CR.

A memory cell array including a plurality of memory cells may be disposed in the cell array regions CR. The memory cell array may include the memory cells arranged in three dimensions and a plurality of word lines connected to the memory cells and a plurality of bit lines connected to the memory cells.

Figure 8:
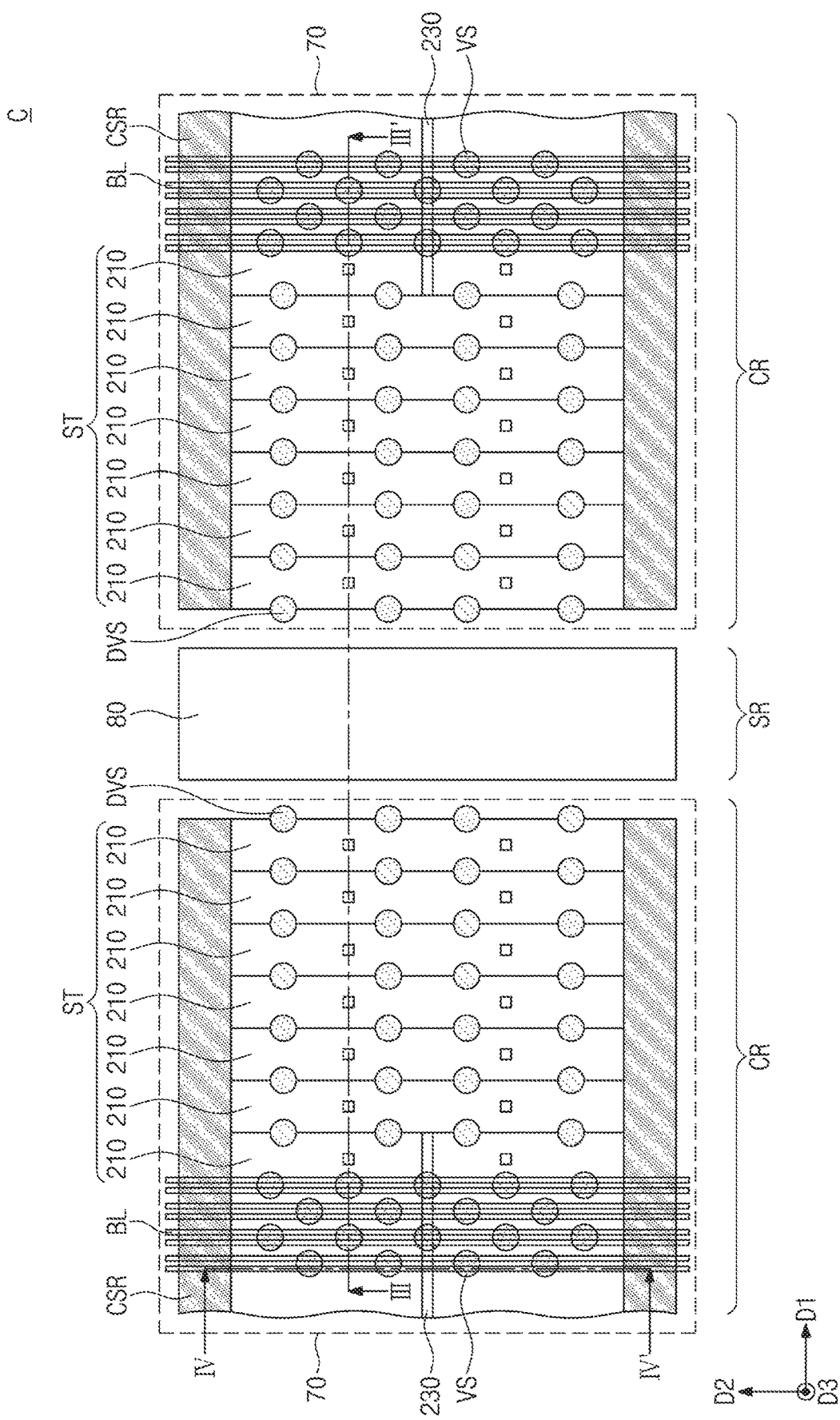
FIG. 8 is a plan view illustrating a semiconductor device according to example embodiments.
Figure 9A:
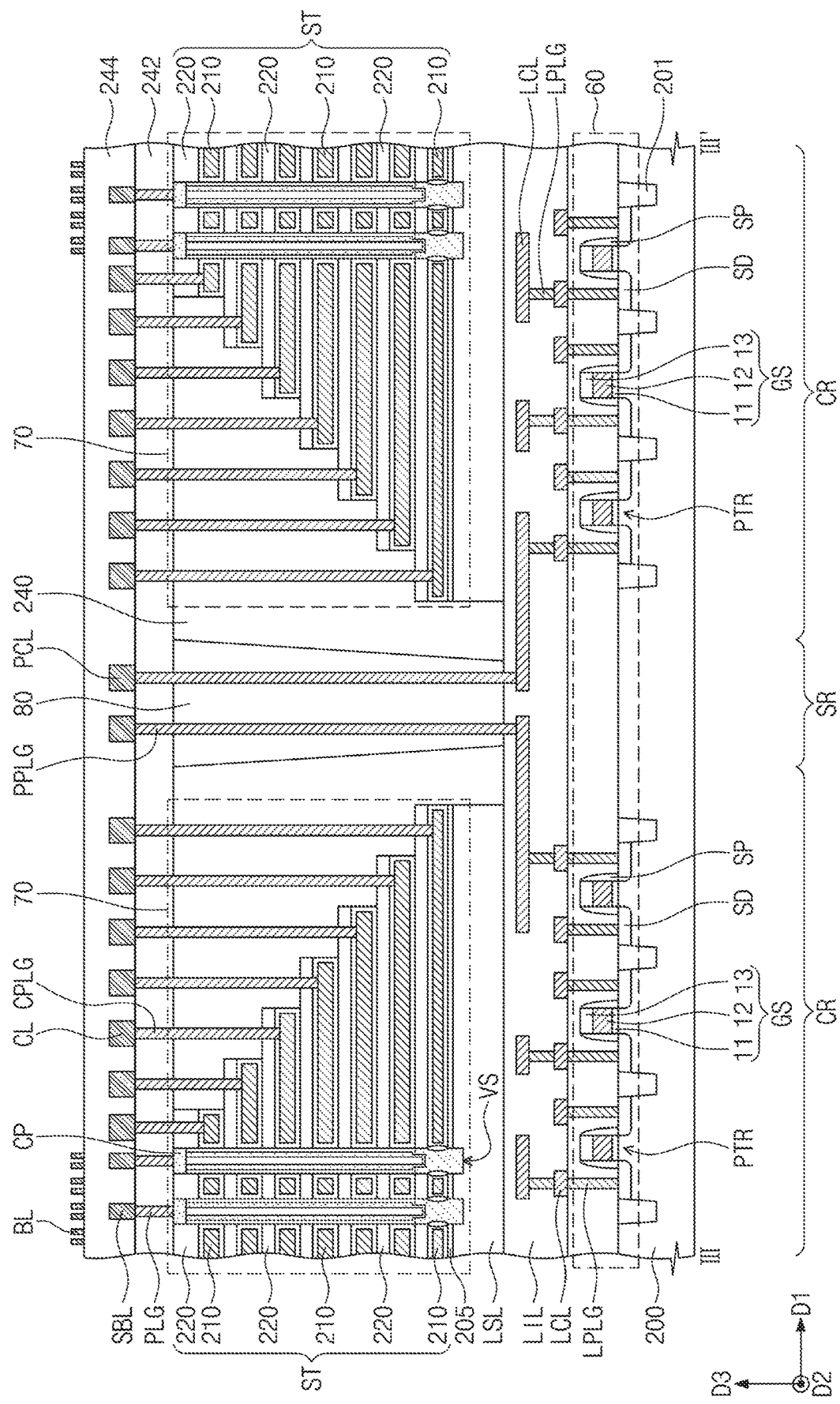
FIGS. 9A and 9B are cross-sectional views illustrating a semiconductor device according to example embodiments.
Figure 9B:
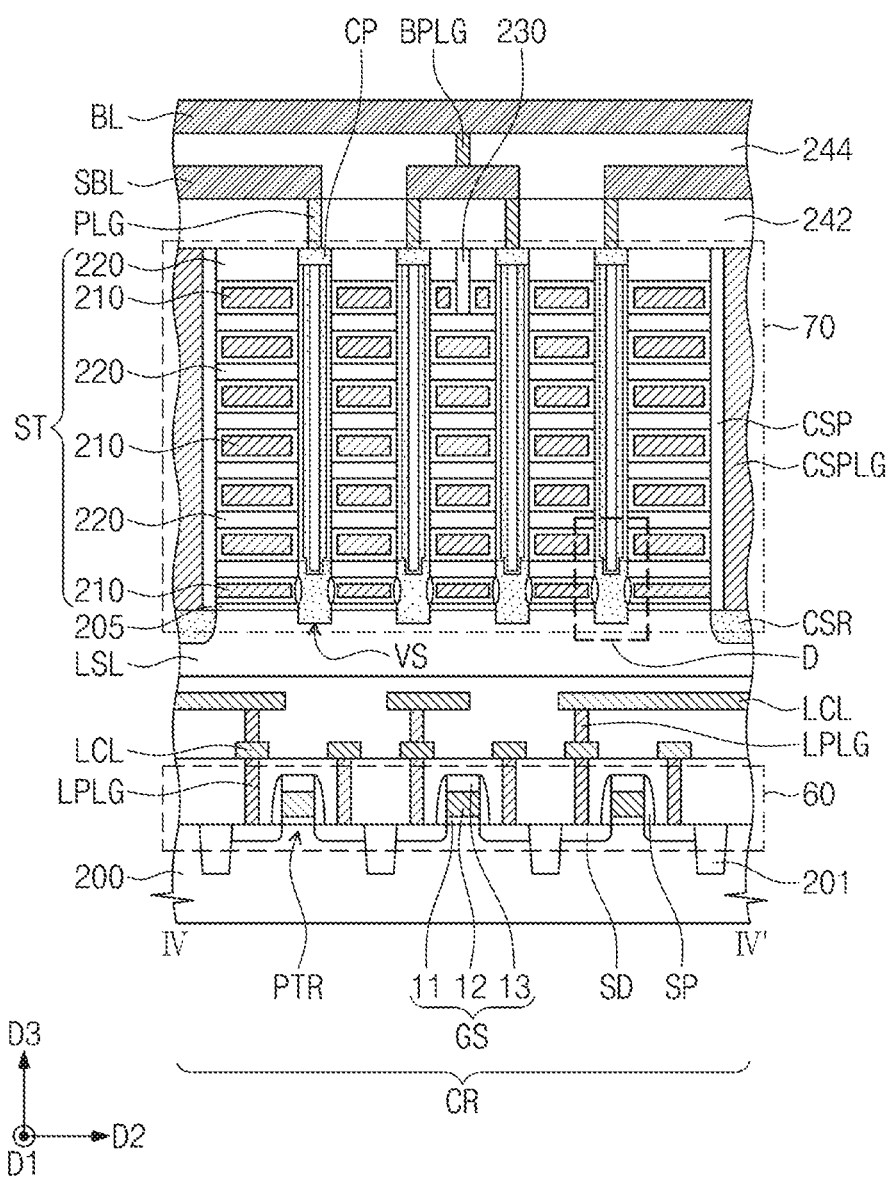
Figure 10:
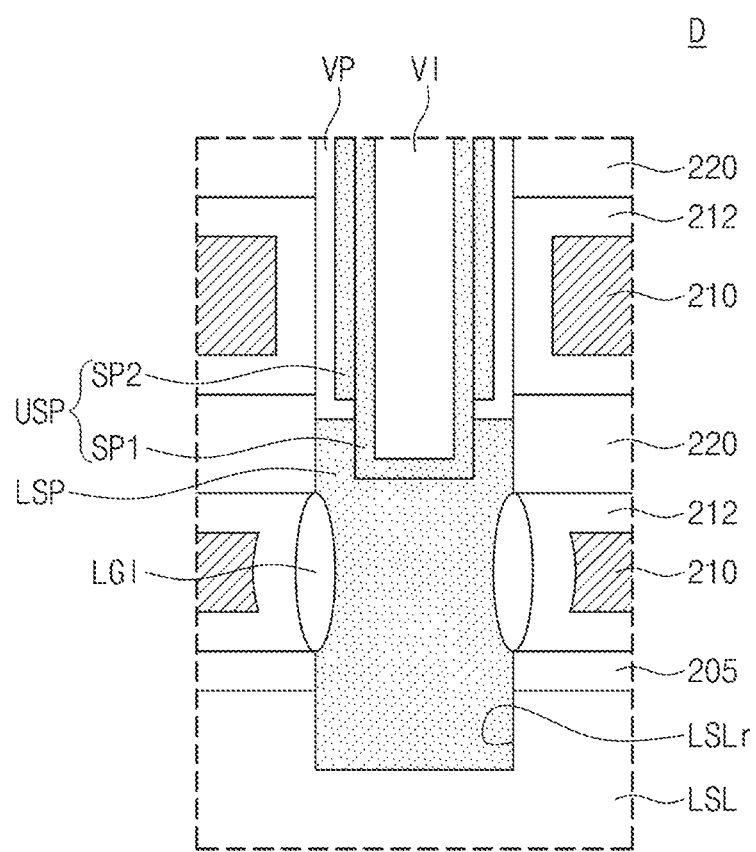
FIG. 10 is an enlarged view illustrating portion D of FIG. 9B.

FIG. 8 is a plan view illustrating a semiconductor device according to example embodiments. FIG. 8 is a plan view corresponding to portion C of FIG. 7. FIGS. 9A and 9B are cross-sectional views illustrating a semiconductor device according to example embodiments. FIG. 9A is a cross-sectional view taken along line of FIG. 8, and FIG. 9B is a cross-sectional view taken along line IV-IV' of FIG. 8. FIG. 10 is an enlarged view illustrating portion D of FIG. 9B. In FIGS. 8, 9A, 9B and 10, the same reference numerals are used to denote the same elements as in FIGS. 2, 3A, 3B and 4. Thus, repeated descriptions thereof may be omitted for brevity.

Referring to FIGS. 8, 9A, 9B and 10, a substrate 200 may include the cell array regions CR and the stress relief region SR. The cell array regions CR may be spaced apart from each other in the first direction D1. The stress relief region SR may be positioned between the cell array regions CR.

The substrate 200 may be a semiconductor substrate. For example, the substrate 200 may include a mono-crystalline silicon layer, a mono-crystalline germanium layer, a silicon layer on a silicon-germanium layer, a silicon layer on an insulating layer, or a polycrystalline semiconductor layer on an insulating layer.

A peripheral structure 60 may be on the substrate 200. The peripheral structure 60 may include a row decoder, a column decoder, a page buffer and/or a control circuit, for writing data in the memory cells and reading the data from the memory cells.

The peripheral structure 60 may include peripheral transistors PTR on the substrate 200. The peripheral transistors PTR may each be disposed on an active region in the substrate 200, defined by an isolation layer 201. The peripheral transistor PTR may be substantially the same as described in FIGS. 2, 3A, 3B and 4.

A lower insulating layer LIL may be provided to cover the peripheral structure 60. The lower insulating layer LIL may have a multi-layered structure. The lower insulating layer LIL may include, for example, silicon oxide, silicon nitride or silicon oxynitride.

Lower interconnection lines LCL and lower plugs LPLG may be disposed in the lower insulating layer LIL to be connected to the peripheral transistors PTR.

Lower semiconductor layers LSL may be disposed on the lower insulating layer LIL in the cell array region CR. The lower semiconductor layers LSL may include a mono-crystalline silicon layer, a mono-crystalline germanium layer, a silicon layer on a silicon-germanium layer, a silicon layer on an insulating layer, or a polycrystalline semiconductor layer on an insulating layer. The lower semiconductor layers LSL may have a first conductivity type (e.g., a p-type conductivity). The lower semiconductor layers LSL may not be disposed on the lower insulating layer LIL in the stress relief region SR.

Memory structures 70 may be disposed on the lower semiconductor layers LSL. The memory structures 70 may each be substantially the same as the memory structure 20 described in FIGS. 2, 3A, 3B and 4. The memory structures 70 may each include a stack structure ST and vertical structures VS.

The stack structure ST may be disposed on the lower semiconductor layers LSL. The stack structure ST may be substantially the same as the stack structure ST described in FIGS. 2, 3A, 3B and 4. The stack structure ST may include conductive patterns 210 and insulating patterns 220 which are alternately and repeatedly stacked on each other. The conductive patterns 210 and the insulating patterns 220 may be substantially the same as the conductive patterns 110 and the insulating patterns 120 described in FIGS. 2, 3A, 3B and 4.

The stack structure ST may have a stepped structure. The stepped structure may be a structure descending toward the substrate 200 as the stack structure ST is closer to the stress relief region SR.

A buffer insulating layer 205 may be disposed between the stack structure ST and the lower semiconductor layers LSL. A thickness of the buffer insulating layer 205 may be less than a thickness of each of the insulating patterns 220. The buffer insulating layer 205 may include, for example, silicon oxide.

A separation insulating layer 230 (FIGS. 8 and 9B) may be disposed in an upper portion of the stack structure ST. The separation insulating layer 230 may separate/divide an uppermost one of the conductive patterns 210 in the second direction D2. The separation insulating layer 230 may include, for example, silicon oxide.

Common source regions CSR may be disposed in the lower semiconductor layers LSL at opposite sides of the stack structure ST in the second direction D2. On the common source regions CSR, common source plugs CSPLG and insulating spacers CSP may be disposed. The common source regions CSR, the common source plugs CSPLG and the insulating spacers CSP may be substantially the same as the common source regions CSR, the common source plugs CSPLG and the insulating spacers CSP described in FIGS. 2, 3A, 3B, and 4.

Vertical structures VS may be disposed on the lower semiconductor layers LSL. The vertical structures VS may be substantially the same as the vertical structure VS described in FIGS. 2, 3A, 3B and 4, except that the vertical structures VS are disposed on the lower semiconductor layers LSL. A lower semiconductor pattern LSP (FIG. 10) may fill a recess region LSLr in an upper surface of the lower semiconductor layers LSL.

A horizontal insulating patterns 212 may be disposed between the vertical structures VS and the conductive patterns 210. The horizontal insulating patterns 212 may each extend on an upper surface and a lower surface of respective ones of the conductive patterns 210. The horizontal insulating patterns 212 may include, for example, silicon oxide, metal oxide or metal nitride.

Dummy vertical structures DVS may be disposed on the stepped structure of the stack structure ST. The dummy vertical structures DVS may be substantially the same as the vertical structure VS. The dummy vertical structures DVS may penetrate edge portions of the conductive patterns 210.

A first interlayer insulating layer 240 (FIG. 9A) may be disposed to cover at least a portion of the memory structures 70. For example, the first interlayer insulating layer 240 may cover the stepped structure of the stack structure ST of each of the memory structures 70 and the lower semiconductor layers LSL. The first interlayer insulating layer 240 may extend to the stress relief region SR. The first interlayer insulating layer 240 may include silicon oxide. A dielectric constant of the first interlayer insulating layer 240 may range from about 3.9 to 5.

A stress relief structure 80 may be disposed on the lower insulating layer LIL in the stress relief region SR. The stress relief structure 80 may be disposed between adjacent stack structures ST. The stress relief structure 80 may be disposed in the first interlayer insulating layer 240.

In some embodiments, the stress relief structure 80 may penetrate an upper surface and/or a lower surface of the first interlayer insulating layer 240. For example, as shown in FIG. 9A, a lower surface of the stress relief structure 80 may be substantially coplanar with a lower surface of the first interlayer insulating layer 240, and an upper surface of the stress relief structure 80 may be substantially coplanar with an upper surface of the first interlayer insulating layer 240. However, the present inventive concepts are not limited thereto.

In some embodiments, a lower portion of the stress relief structure 80 may extend or be inserted into the lower insulating layer LIL, similar to the stress relief structure 30 in FIG. 5A. Thus, a lower surface of the stress relief structure 80 may be positioned at a lower level than a lower surface of the first interlayer insulating layer 240.

In some embodiments, a lower surface of the stress relief structure 80 may be positioned at a higher level than a lower surface of the first interlayer insulating layer 240, similar to the stress relief structure 30 in FIG. 5B. For example, the stress relief structure 80 may not penetrate all the way through first interlayer insulating layer 240, but rather may only partially penetrate the first interlayer insulating layer 240.

In some embodiments, the stress relief structure 80 may penetrate a second interlayer insulating layer 242 and the first interlayer insulating layer 240, similar to the stress relief structure 30 in FIG. 5C. An upper surface of the stress relief structure 80 may be substantially coplanar with an upper surface of the second interlayer insulating layer 242.

The stress relief structure 80 may include a different material from the first interlayer insulating layer 240. The stress relief structure 80 may include a material capable of relaxing stress between the cell array regions CR.

In some embodiments, the stress relief structure 80 may include a material having a lower dielectric constant than the first interlayer insulating layer 240. For example, the stress relief structure 80 may include fluorine-doped silicon oxide, carbon-doped silicon oxide, porous silicon oxide, polyimide, polynorbornene, benzocyclobutene, polytetrafluoroethylene (PTFE), hydrogen silsesquioxane (HSQ) or methylsilsesquioxane (MSQ). Alternatively, the stress relief structure 80 may include silicon nitride or silicon oxynitride.

The second interlayer insulating layer 242 may be disposed on the first interlayer insulating layer 240. The second interlayer insulating layer 242 may extend across the cell array regions CR and the stress relief region SR. The second interlayer insulating layer 242 may include, for example, silicon oxide, silicon nitride or silicon oxynitride.

Contact plugs PLG (FIG. 9B) and cell contact plugs CPLG (FIG. 9A) may be disposed on the substrate 200 in the cell array region CR. The contact plugs PLG may penetrate the second interlayer insulating layer 242 to contact the vertical structures VS, respectively. The cell contact plugs CPLG may penetrate the first and second interlayer insulating layers 240 and 242 to contact the conductive patterns 210, respectively.

Peripheral contact plugs PPLG (FIG. 9A) may be disposed on the substrate 200 in the stress relief region SR. The peripheral contact plugs PPLG may penetrate the second interlayer insulating layer 242, the stress relief structure 80 and a portion of the lower insulating layer LIL and may be electrically connected to the lower interconnection lines LCL. The peripheral contact plugs PPLG may be electrically connected to the peripheral transistors PTR. The peripheral contact plugs PPLG may be referred to herein as "interconnections" that extend through the stress relief structure 80, which may reduce a parasitic capacitance between the interconnections.

Sub bit lines SBL may be disposed on the second interlayer insulating layer 242 in the cell array region CR. The sub bit lines SBL may each be connected to a pair of the contact plugs PLG.

Interconnection lines CL may be disposed on the second interlayer insulating layer 242 in the cell array region CR. The interconnection lines CL may be electrically connected to the cell contact plugs CPLG.

Peripheral interconnection lines PCL may be disposed on the second interlayer insulating layer 242 in the stress relief region SR. The peripheral interconnection lines PCL may be electrically connected to the peripheral contact plugs PPLG.

A third interlayer insulating layer 244 may be disposed on the second interlayer insulating layer 242. The third interlayer insulating layer 244 may cover the sub bit lines SBL, the interconnection lines CL and the peripheral interconnection lines PCL.

Bit lines BL may be disposed on the third interlayer insulating layer 244. The bit lines BL may extend in the second direction D2 and may be connected to the sub bit lines SBL through a bit line contact plug BPLG (FIG. 9B).

According to some example embodiments, the stress relief region SR may be provided between the cell array regions CR. The stress relief structure 80 may be provided in the first interlayer insulating layer 240 in the stress relief region SR. The stress relief structure 80 may include a material capable of relaxing the stress between the cell array regions CR. Thus, the stress between the cell array regions CR may be relaxed.

The peripheral contact plugs PPLG may be disposed on the substrate 200 in the stress relief region SR to electrically connect the peripheral transistors PTR and the peripheral interconnection lines PCL. The stress relief region SR may include a material having a lower dielectric constant than the first interlayer insulating layer 240, and thus a parasitic capacitance between the peripheral contact plugs PPLG may be reduced.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor memory device comprising:
 a substrate including a cell array region, a peripheral circuit region, and a stress relief region between the cell array region and the peripheral circuit region;
 a memory structure on the substrate in the cell array region;
 a peripheral structure on the substrate in the peripheral circuit region, the peripheral structure including transistors and an isolation layer between the transistors;
 an interlayer insulating layer on at least a portion of the memory structure and the peripheral structure; and
 a stress relief structure in the interlayer insulating layer in the stress relief region,
 wherein a lower surface of the stress relief structure is located at a lower level than an upper surface of the isolation layer.

2. The semiconductor memory device of claim 1, wherein the stress relief structure includes a different material from the interlayer insulating layer.

3. The semiconductor memory device of claim 1, wherein the stress relief structure has a lower dielectric constant than the interlayer insulating layer.

4. The semiconductor memory device of claim 1,
 wherein the interlayer insulating layer includes silicon oxide, and
 wherein the stress relief structure includes silicon nitride or silicon oxynitride.

5. The semiconductor memory device of claim 1,
 wherein the interlayer insulating layer comprises a first interlayer insulating layer,
 wherein the semiconductor memory device further comprises a second interlayer insulating layer on the memory structure and the first interlayer insulating layer in the cell array region and the peripheral circuit region, and
 wherein the stress relief structure penetrates the first and second interlayer insulating layers.

6. The semiconductor memory device of claim 1, wherein the lower surface of the stress relief structure is located at a lower level than a lower surface of the isolation layer.

7. The semiconductor memory device of claim 1,
 wherein the cell array region and the peripheral circuit region are spaced apart from each other in a first direction, and
 wherein the stress relief structure has a width in the first direction that continuously decreases with decreasing distance from a bottom surface of the substrate.

8. The semiconductor memory device of claim 1,
 wherein the cell array region and the peripheral circuit region are spaced apart from each other in a first direction,
 wherein the memory structure includes a semiconductor structure therein, and
 wherein a width in the first direction of a bottom end of the stress relief structure is wider than the semiconductor structure.

9. A semiconductor memory device comprising:
 a substrate including a memory cell region and a peripheral region spaced apart from each other in a first direction;
 a stack of alternating conductive layers and insulating layers on the substrate in the memory cell region;
 a semiconductor structure in the stack;
 an insulator on a stepped portion of the stack, the insulator including a trench therein, the trench having a width in the first direction that decreases with decreasing distance from a bottom surface of the substrate; and
 a stress relief material filing the trench,
 wherein the stress relief material is between the stepped portion of the stack and the peripheral region, and
 wherein the stress relief material is wider than the semiconductor structure.

10. The semiconductor memory device of claim 9, further comprising a peripheral structure on the substrate in the peripheral region, the peripheral structure including transistors and an isolation layer between the transistors,
 wherein a lower surface of the stress relief material is located at a lower level than an upper surface of the isolation layer.

11. The semiconductor memory device of claim 10, wherein the lower surface of the stress relief material is located at a lower level than a lower surface of the isolation layer.

12. The semiconductor memory device of claim 9, wherein the stress relief material includes a different material from the insulator.

13. The semiconductor memory device of claim 9, wherein the stress relief material has a lower dielectric constant than the insulator.

14. The semiconductor memory device of claim 9, wherein the stress relief material contacts the substrate.

15. The semiconductor memory device of claim 9,
wherein the insulator comprises a first interlayer insulating layer,
wherein the semiconductor memory device further comprises a second interlayer insulating layer on the first interlayer insulating layer in the memory cell region and the peripheral region, and
wherein the stress relief material penetrates the first and second interlayer insulating layers.

16. A semiconductor memory device comprising:
a substrate including a memory cell region and a peripheral region spaced apart from each other in a first direction;
a stack of alternating conductive layers and insulating layers on the substrate in the memory cell region;
a semiconductor structure in the stack;
an insulator on a stepped portion of the stack, the insulator including a trench therein; and
a stress relief material in the insulator, the stress relief material being between the stepped portion of the stack and the peripheral region,
wherein the stress relief material has a width in the first direction that continuously decreases with decreasing distance from a bottom surface of the substrate,
wherein, at a bottom end of the stress relief material, the width in the first direction is wider than the semiconductor structure,
wherein the stress relief material contacts the substrate, and
wherein the stress relief material includes a different material from the insulator.

17. The semiconductor memory device of claim 16, further comprising a peripheral structure on the substrate in the peripheral region, the peripheral structure including transistors and an isolation layer between the transistors,
wherein a lower surface of the stress relief material is located at a lower level than an upper surface of the isolation layer.

18. The semiconductor memory device of claim 16, wherein the stress relief material has a lower dielectric constant than the insulator.

19. The semiconductor memory device of claim 16,
wherein the insulator includes silicon oxide, and
wherein the stress relief material includes silicon nitride or silicon oxynitride.

20. The semiconductor memory device of claim 16,
wherein the insulator comprises a first interlayer insulating layer,
wherein the semiconductor memory device further comprises a second interlayer insulating layer on the first interlayer insulating layer in the memory cell region and the peripheral region, and
wherein the stress relief material penetrates the first and second interlayer insulating layers.

\* \* \* \* \*